(12) United States Patent
Naito (10) Patent No.: US 8,093,972 B2
(45) Date of Patent: Jan. 10, 2012

(54) ELECTROMECHANICAL DEVICE AND ELECTRICAL DEVICE WITH THE ELECTROMECHANICAL DEVICE

(75) Inventor: Yasuyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 294 days.

(21) Appl. No.: 12/520,316

(22) PCT Filed: Nov. 12, 2008

(86) PCT No.: PCT/JP2008/003285
§ 371 (c)(1),
(2), (4) Date: Jun. 19, 2009

(87) PCT Pub. No.: WO2009/063627
PCT Pub. Date: May 22, 2009

(65) Prior Publication Data
US 2009/0283391 A1    Nov. 19, 2009

(30) Foreign Application Priority Data

Nov. 14, 2007  (JP) ................................. 2007-295017

(51) Int. Cl.
*H01H 51/22* (2006.01)

(52) U.S. Cl. .......................................... 335/78; 200/181

(58) Field of Classification Search .................... 335/78; 200/181
See application file for complete search history.

(56) References Cited

U.S. PATENT DOCUMENTS

| 5,278,368 A * | 1/1994 | Kasano et al. ................ 200/181 |
| 2004/0031670 A1 | 2/2004 | Wong |
| 2005/0099252 A1 * | 5/2005 | Isobe et al. ....................... 335/78 |
| 2007/0181411 A1 * | 8/2007 | Ikehashi et al. ............... 200/181 |

FOREIGN PATENT DOCUMENTS

| JP | 2006-253039 | 9/2006 |
| JP | 2007-26804 | 2/2007 |

OTHER PUBLICATIONS

International Search Report issued Jan. 6, 2009 in the International (PCT) Application No. PCT/JP2008/003285.
International Preliminary Report on Patentability issued Jul. 8, 2010 in International (PCT) Application No. PCT/JP2008/003285.

\* cited by examiner

*Primary Examiner* — Bernard Rojas
(74) *Attorney, Agent, or Firm* — Wenderoth, Lind & Ponack, L.L.P.

(57) ABSTRACT

When a high power signal is input to an electromechanical device, electrostatic force can automatically and unintentionally drive the movable electrode. A high reliability electromechanical device that prevents this is achieved. The electromechanical device of the invention is an electromechanical device formed on a substrate, and having a signal electrode and a drive electrode formed across a gap from a movable electrode. Applying an attraction force between the movable electrode and the drive electrode enables the movable electrode to contact the signal electrode. A high electrostatic capacitance is formed by disposing the movable electrode and drive electrode in opposition with a dielectric layer therebetween on the RF signal input port side. As a result, the potential difference between the movable electrode and drive electrode is reduced even when a high power signal is input, and a high reliability electromechanical device can be achieved.

15 Claims, 5 Drawing Sheets

ELECTROMECHANICAL DEVICE AND ELECTRICAL DEVICE WITH THE ELECTROMECHANICAL DEVICE

BACKGROUND OF THE INVENTION

1. Field of Invention

The present invention relates to an electrically driven electromechanical device, and relates more particularly to an electromechanical device and an electrical device with the electromechanical device.

2. Description of Related Art

Electromechanical devices are used in many different fields, including telecommunications, optics, acceleration sensors, and biotechnology, and can be used for switches, filters, and other devices particularly in wireless terminal devices. As wireless terminal devices and other data communication devices have come into widespread use, small wireless terminal devices that are compatible with different communication systems have become desirable. Because the number of passive devices such as switches that are used inside the terminal housing increases in such multimode terminal devices, reducing the size of the passive devices is desirable.

Radio frequency MEMS (RF-MEMS) switches manufactured using microelectromechanical systems (MEMS) technology are one potential solution to this problem. An RF-MEMS switch is a switch that moves a movable microelectrode to mechanically switch the signal transmission path. Its advantages include outstanding RF characteristics such as ultralow insertion loss, high isolation, and linearity. RF-MEMS switches can also be manufactured in processes that are compatible with semiconductor manufacturing processes, can therefore be easily incorporated in RF integrated circuit (RF-IC) devices, and are expected to contribute greatly to reducing communication unit size.

Conventional RF-MEMS switches are mechanical switches that have a membrane or beam-shaped actuator that is supported by a cantilevered beam clamp or a fixed-fixed beam clamp fixing the actuator at both ends, and switch the signal transmission path by causing the actuator to contact or separate from an electrode. The drive power source of the actuator is commonly electrostatic power, but magnetic and other actuation methods are also known.

A series RF-MEMS switch that is inserted in series to the signal transmission path is described next. A thin membrane approximately several hundred micrometers long is formed as a movable electrode on an extension of the signal line carrying the RF signal. The distal end of the movable electrode is open when the switch is off. When a drive electrode is disposed directly below the movable electrode and a DC voltage is applied, the movable electrode is pulled by electrostatic force and deflects to the drive electrode side, thus contacting the signal electrode that outputs the signal. The signal path between the movable electrode and the signal electrode thus shorts, and the RF signal flows through the movable electrode to the signal electrode and turns on. If a DC potential is not applied to the drive electrode, the movable electrode and signal electrode do not make contact, and the RF signal is interrupted and turns off.

See, for example, US Patent Application Publication No. 2004/0031670A1.

However, when a strong signal is input to the electromechanical device, a potential difference is produced between the movable electrode and the drive electrode, and a problem known as self-actuation in which the movable electrode is unintentionally driven automatically by the electrostatic force occurs. Self-actuation can cause such problems as structural failure due to operational errors or a strong drive force, or make it difficult for electrodes that have made contact to separate, and thus is a cause of reduced reliability in electromechanical devices.

A solution to this problem is taught in US Patent Application Publication No. 2004/0031670A1. More particularly, power is passed to ground by turning a solid state device disposed parallel to the electromechanical device on so that high power is not input to the electromechanical device. This construction requires a solid state component, thus increasing both size and cost as a result of the increased number of components.

SUMMARY OF THE INVENTION

The present invention is directed to solving the foregoing problem of the related art, and an object of the invention is to provide high reliability during high power input to an electromechanical device while also reducing device size and cost.

An electromechanical device according to a first aspect of the present invention is an electromechanical device that is formed on a substrate and has a first electrode and a second electrode and third electrode formed across a gap, the first electrode being capable of contacting the second electrode when an attraction force is applied between the first electrode and third electrode; and an electrostatic capacitance formed by the first electrode and third electrode disposed in opposition through a dielectric layer on the RF signal input port side.

In this aspect of the invention an RF signal travels to the movable electrode and drive electrode through the electrical capacitance formed on the signal input side of the electromechanical device. The occurrence of a high potential difference between the movable electrode and drive electrode due to high power input can thus be avoided and self-actuation can be avoided. A high reliability electromechanical device that can be used with high power signal input is achieved. The capacity of the drive electrode can also be increased, and the electrostatic force can be increased. A low-voltage-driven electromechanical device with high speed response is achieved.

In an electromechanical device according to another aspect of the invention the dielectric layer is a dielectric membrane.

This aspect of the invention enables easily manufacturing a structurally stable electromechanical device.

In an electromechanical device according to another aspect of the invention the dielectric layer is a gap.

This aspect of the invention reduces the number of production steps and enables reducing cost.

In an electromechanical device according to another aspect of the invention the RF signal branches to and travels through the first electrode and third electrode.

This aspect of the invention avoids the occurrence of a high potential difference between the movable electrode and drive electrode due to high power input and can thus avoid self-actuation.

An electromechanical device according to another aspect of the invention has a first electrode having a first part, a second part, and a third part integrated with one another; a second electrode having a first opposing part opposite the first part; and a third electrode having a second opposing part opposite the second part through an intervening gap, and a third opposing part opposite the third part. The third electrode includes an input node that receives a first drive voltage referenced to a DC potential of the first electrode. The gap is set to a first predetermined distance when the first drive voltage is a first voltage, and the gap is set to a second predetermined distance when the first drive voltage is a second voltage. The first part is separated from the first opposing part and electrically isolated from the first opposing part when the first drive voltage is the first voltage, and when the first drive voltage is the second voltage, the first part contacts the first opposing part and is electrically conductive with the first opposing part, and an RF signal input to the first electrode is substantially output from the second electrode. The third part and the third opposing part constitute a first electrical capacitance of a predetermined capacity.

Another aspect of the invention is an electrical device having the electromechanical device described above.

The electromechanical device and electrical device with the electromechanical device according to the present invention can reduce the potential difference produced by the power between the first electrode and third electrode by the first electrical capacitance. As a result, when a high power RF signal is input to the electromechanical device, a potential difference is not caused by the RF signal between the first electrode and third electrode, and the self-actuation problem of electrostatic force causing the first electrode to actuate automatically can be avoided. A high reliability electromechanical device and electrical device with the electromechanical device that can switch reliably between the on state and off state regardless of the input RF signal can thus be achieved.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 3B is an equivalence circuit diagram showing the configuration of the electromechanical device according to the preferred embodiment of the invention when on.

FIG. 5A is an equivalence circuit diagram showing the configuration of the electromechanical device according to the preferred embodiment of the invention when on.

DETAILED DESCRIPTION OF THE PREFERRED EMBODIMENTS

Some preferred embodiments of the invention are described below with reference to the accompanying figures wherein parts having the same arrangement, operation, and effect are denoted by the same reference numbers. Numbers used in the following description are by way of example only to describe the invention clearly, and the invention is not limited to these numbers in any way.

Embodiment 1

Figure 1A:
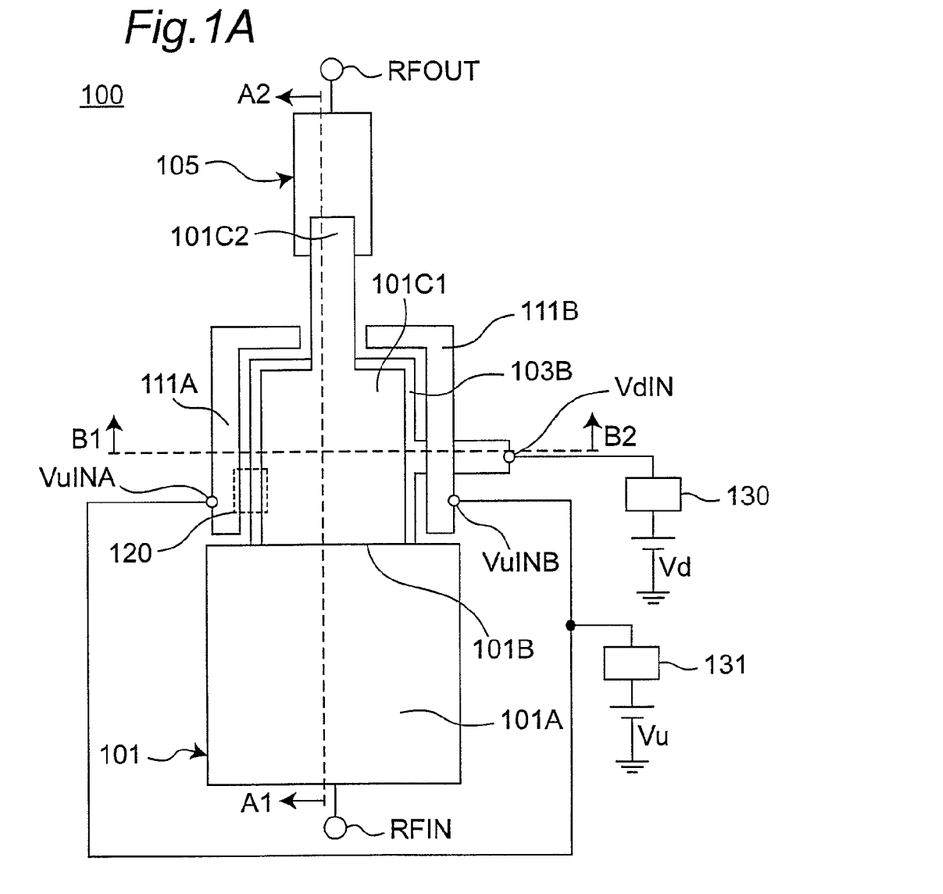
FIG. 1A is a plan view showing the configuration of an electromechanical device according to a preferred embodiment of the invention.
Figure 1B:
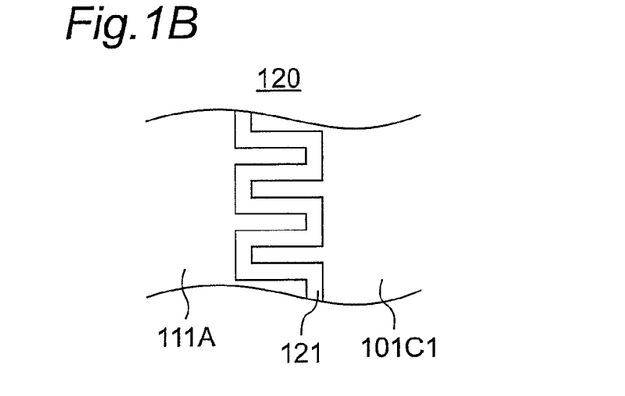
FIG. 1B is an enlarged view of a part of FIG. 1A.
Figure 2A:
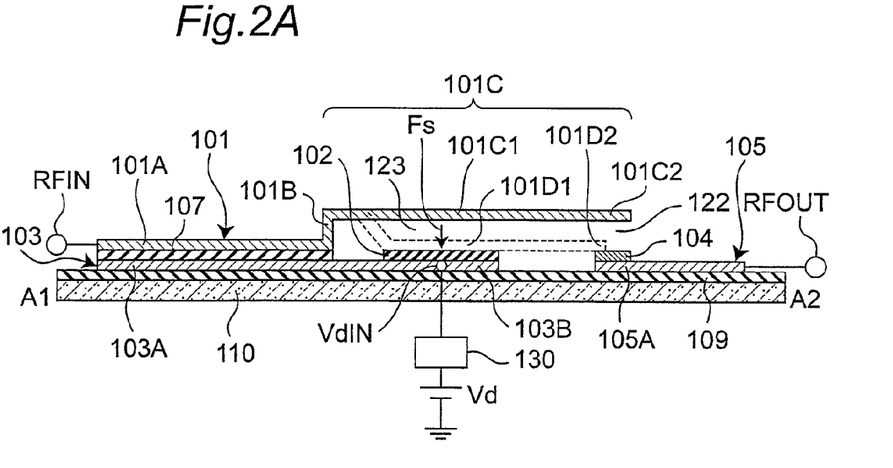
FIG. 2A is a section view showing section A1-A2 in FIG. 1A.
Figure 2B:
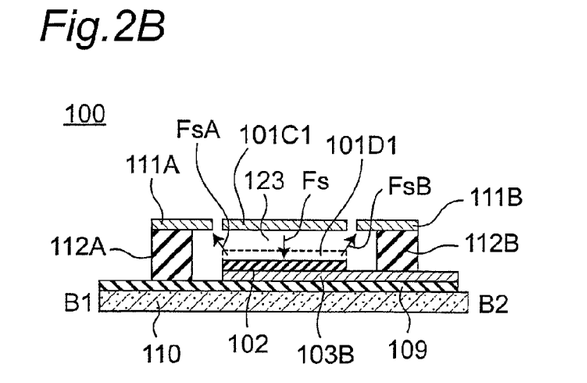
FIG. 2B is a section view showing section B1-B2 in FIG. 1A.

FIG. 1A is a plan view showing the configuration of an electromechanical device 100 according to a preferred embodiment of the invention, and FIG. 1B is a schematically enlarged view of the partial area 120 in FIG. 1A. FIG. 2A is a section view showing section A1-A2 in FIG. 1A, and FIG. 2B is a section view showing section B1-B2 in FIG. 1A.

As shown in FIG. 1A to FIG. 2B, the electromechanical device 100 has a substrate 110, a dielectric layer 107, a dielectric layer 109, a signal electrode 105, a contact 104, a movable electrode 101, a drive electrode 103, a dielectric layer 102, fixed comb electrodes 111A and 111B, and support parts 112A and 112B. The substrate 110 is typically a semiconductor substrate made of a semiconductor material. The dielectric layer 109 is formed on the substrate 110, constituting an isolation membrane between layers.

The movable electrode 101 bends at a movable electrode bending part 101B, and includes a movable electrode fixing part 101A on one side and a movable electrode moving part 101C on the other side. More specifically, the movable electrode fixing part 101A and movable electrode moving part 101C are bent at the movable electrode bending part 101B. The movable electrode fixing part 101A is fixed to the substrate 110 through an intervening dielectric layer 107, drive electrode 103, and dielectric layer 109, and the movable electrode moving part 101C is suspended in air. The movable electrode 101 is thus deflectable, and has a cantilevered structure with the movable electrode moving part 101C being a free body. The movable electrode moving part 101C includes a movable electrode driving part 101C1 and a movable electrode opening/closing part 101C2. The movable electrode 101 thus has a movable electrode fixing part 101A, a movable electrode bending part 101B, a movable electrode driving part 101C1, and a movable electrode opening/closing part 101C2 that are integrated with one another. The movable electrode bending part 101B is positioned between the movable electrode fixing part 101A and movable electrode driving part 101C1, and the movable electrode driving part 101C1 is positioned between the movable electrode bending part 101B and movable electrode opening/closing part 101C2.

The signal electrode 105 has a signal electrode opening/closing part 105A positioned opposite the movable electrode opening/closing part 101C2 through the contact 104 and electrode gap 122. The contact 104 is formed on the signal electrode opening/closing part 105A, and the signal electrode 105 is formed on the dielectric layer 109. The contact 104 is provided to reduce contact resistance between the movable electrode 101 and signal electrode 105. The signal electrode 105 and contact 104 constitute an integrated signal electrode. The signal electrode opening/closing part 105A and contact 104 constitute an integrated signal electrode opening/closing part. This integrated signal electrode opening/closing part is also an opening/closing part opposing part.

The drive electrode 103 has a drive electrode fixing part 103A positioned opposite the movable electrode fixing part 101A with the dielectric layer 107 therebetween, and a drive electrode driving part 103B positioned opposite the movable electrode driving part 101C1 through the dielectric layer 102 and electrode gap 123. The drive electrode fixing part 103A is also called a fixing part opposing part, and the drive electrode driving part 103B is also called a drive part opposing part. The dielectric layer 102 is formed on the drive electrode driving part 103B, and the drive electrode 103 is formed on the dielectric layer 109. The dielectric layer 107 is formed on the drive electrode fixing part 103A, and the movable electrode fixing part 101A is formed on the dielectric layer 107. The dielectric layer 107 can be constituted using a dielectric membrane or an air gap. If the dielectric layer 107 is a dielectric membrane, and particularly if it is solid state dielectric membrane, a structurally stable electromechanical device 100 can be easily manufactured. If an air gap is used, the movable electrode fixing part 101A must be fixed to the substrate 110 using a dielectric membrane or other member in part, but the total number of production steps can be reduced and the cost can be reduced. The movable electrode fixing part 101A and drive electrode fixing part 103A are thus proximally disposed with surfaces thereof in opposition through the dielectric layer 107.

Fixed comb electrodes 111A and 111B are disposed substantially coplanar to the movable electrode driving part 101C1 at a position surrounding the movable electrode driving part 101C1, and are respectively formed on support parts 112A and 112B. The support parts 112A and 112B are dielectric bodies, and are formed on the dielectric layer 109 or drive electrode driving part 103B. As shown in FIG. 1B, the sides of the fixed comb electrodes 111A and 111B and movable electrode driving part 101C1 have a comb-like shape of tines and spaces, and the fixed comb electrodes 111A and 111B and movable electrode driving part 101C1 are disposed so that the spaces of one mesh with the tines of the other across the electrode gap 121.

The electrical configuration and switching operation of the electromechanical device 100 is described next.

Figure 3A:
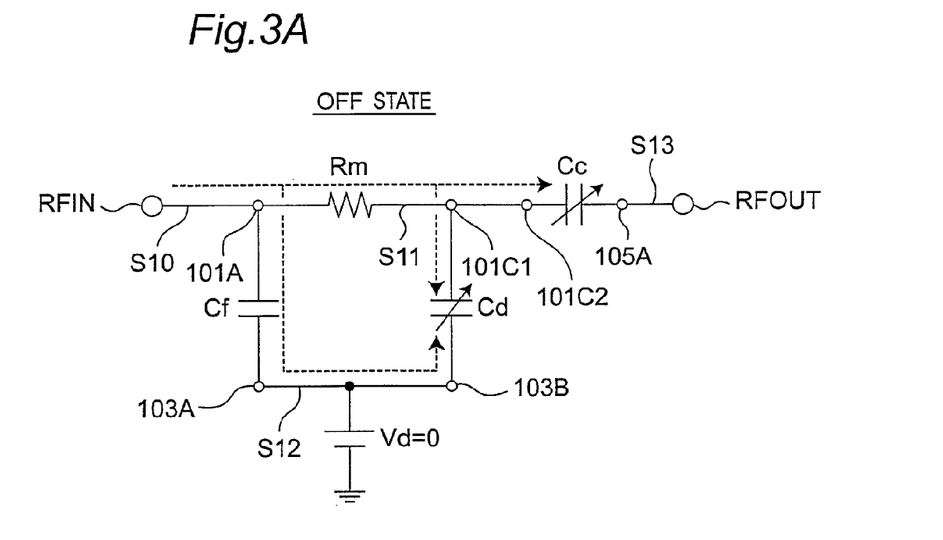
FIG. 3A is an equivalence circuit diagram showing the configuration of the electromechanical device according to the preferred embodiment of the invention when off.
Figure 3B:
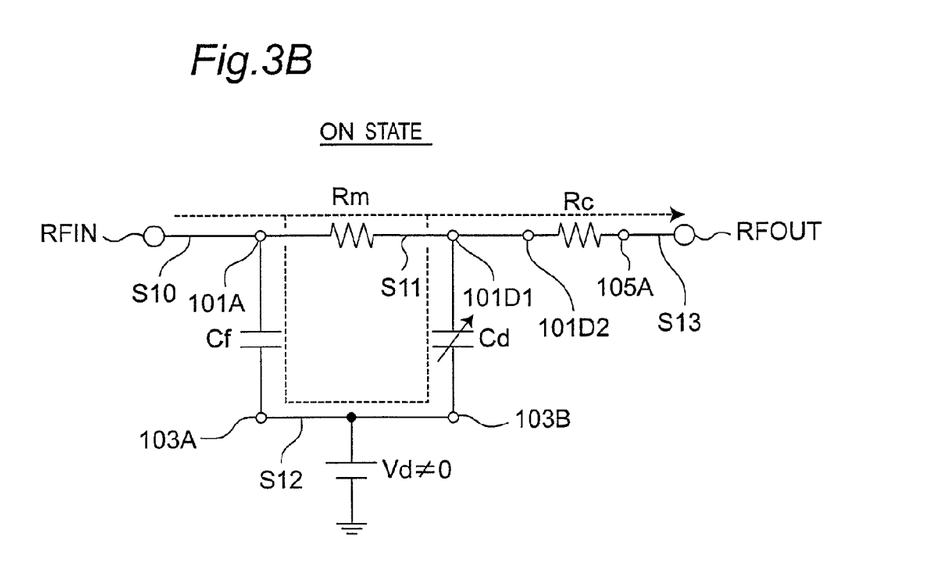

FIG. 3A is an equivalence circuit diagram showing the off state of the electromechanical device, and FIG. 3B is an equivalence circuit diagram showing the on state.

In FIG. 1A and FIG. 2A input node RFIN denotes the pole to which the RF signal is input to the electromechanical device 100, and is connected to the movable electrode fixing part 101A.

Output node RFOUT denotes the pole from which the RF signal is output from the electromechanical device 100, and is connected to the signal electrode 105.

Drive node VdIN denotes the node where the drive voltage Vd referenced to the DC potential of the movable electrode 101 is applied to the drive electrode 103, and is connected to the drive electrode driving part 103B.

Drive nodes VuINA and VuINB respectively denote the nodes where the drive voltage Vu referenced to the DC potential of the movable electrode 101 is applied to the fixed comb electrodes 111A and 111B, and are respectively connected to the fixed comb electrodes 111A and 111B.

The input node RFIN is connected to the movable electrode fixing part 101A. The drive node VdIN may be connected to any part of the drive electrode 103, and not just the drive electrode driving part 103B.

The DC potential of the movable electrode 101 and signal electrode 105 is held substantially to ground in a typical example. In this situation the drive voltages Vd and Vu denote potentials referenced to ground.

The drive voltage supply part 130 supplies the drive voltage Vd through the drive node VdIN to the drive electrode 103.

The drive voltage supply part 131 supplies the drive voltage Vu through the drive nodes VuINA and VuINB to the fixed comb electrodes 111A and 111B, respectively. The drive voltage supply parts 130 and 131 can respectively supply drive voltages Vd and Vu continuously for a desired period and stop the supply for another desired period. The timing for continuing and stopping the drive voltage supply in a typical application is synchronized between the drive voltage supply parts 130 and 131.

The off state of the electromechanical device 100 is described first. In this state the drive voltage Vd is not applied between the movable electrode 101 and drive electrode 103. The movable electrode 101 is in the non-deflected initial position and is not in contact with the signal electrode 105. A signal path is not formed between the movable electrode 101 and the signal electrode 105. The electrostatic capacitance Cc formed between the movable electrode 101 and the signal electrode 105 through the electrode gap 122 is low, and goes to an alternating high impedance state when the RF signal is conducted. The RF signal power is therefore greatly attenuated, and the RF signal cannot pass from the movable electrode 101 to the signal electrode 105.

The drive electrode driving part 103B and movable electrode driving part 101C1 are thus separated a distance equal to the sum of the distance across the electrode gap 123 and the thickness of the dielectric layer 102. As a result, the movable electrode opening/closing part 101C2 and the integrated signal electrode opening/closing part are separated by the size of the electrode gap 122, and the movable electrode 101 and signal electrode 105 are electrically isolated.

A fixing part capacitance Cf is formed through the dielectric layer 107 between the movable electrode fixing part 101A and drive electrode fixing part 103A. Because the movable electrode fixing part 101A and drive electrode fixing part 103A are proximally disposed with surfaces thereof in opposition with the dielectric layer 107 therebetween, the fixing part capacitance Cf is high and the impedance is sufficiently low.

A drive part capacitance Cd is formed between the movable electrode driving part 101C1 and the drive electrode driving part 103B. Because the electrode gap 123 and dielectric layer 102 intervene between the movable electrode driving part 101C1 and the drive electrode driving part 103B when the electromechanical device 100 is in the off state, the electrodes are separated, the drive part capacitance Cd is low, and impedance is high.

An opening/closing part capacitance Cc is formed between the movable electrode opening/closing part 101C2 and the integrated signal electrode opening/closing part. Because there is an electrode gap 122 between the movable electrode opening/closing part 101C2 and the integrated signal electrode opening/closing part when the electromechanical device 100 is in the off state, the electrodes are separated, the opening/closing part capacitance Cc is low, and the impedance is high.

A movable electrode resistance Rm is formed between the movable electrode fixing part 101A and movable electrode driving part 101C1.

In a typical application the distance across the electrode gap 123 and the distance across the electrode gap 122 are substantially equal. Therefore, the distance between the movable electrode driving part 101C1 and the drive electrode driving part 103B is greater only by the thickness of the dielectric layer 102 than the distance between the movable electrode opening/closing part 101C2 and the integrated signal electrode opening/closing part. However, the area of the opposing parts of the movable electrode opening/closing part 101C2 and the integrated signal electrode opening/closing part is significantly greater in a typical application than the area of the opposing parts of the movable electrode driving part 101C1 and the drive electrode driving part 103B in order to increase the drive force of the switching operation. As a result, the drive part capacitance Cd is greater than the opening/closing part capacitance Cc.

Furthermore, because the movable electrode fixing part 101A is not moved by switching, the fixing part capacitance Cf does not require an electrode gap 123 or 122, which are the space in which the movable electrode 101 operates for switching. As a result, the distance between the movable electrode fixing part 101A and the drive electrode fixing part 103A is significantly shorter than the distance between the movable electrode opening/closing part 101C2 and the integrated signal electrode opening/closing part. In addition, the area of the opposing parts of the movable electrode fixing part 101A and the drive electrode fixing part 103A is significantly greater than the area of the opposing parts of the movable electrode opening/closing part 101C2 and the integrated signal electrode opening/closing part, and substantially equal to or greater than the area of the opposing parts of the movable electrode driving part 101C1 and the drive electrode driving part 103B. As a result, the fixing part capacitance Cf is significantly greater than the drive part capacitance Cd and opening/closing part capacitance Cc.

The input RF signal S10 that is input to the input node RFIN splits at the movable electrode fixing part 101A into a main RF signal S11 and a branch RF signal S12. The main RF signal S11 travels from the movable electrode fixing part 101A through the movable electrode resistance Rm to the movable electrode driving part 101C1. The branch RF signal S12 travels from the movable electrode fixing part 101A through the fixing part capacitance Cf and drive electrode fixing part 103A to the drive electrode driving part 103B. The impedance of the fixing part capacitance Cf is sufficiently low, and the impedance of the drive part capacitance Cd is high. The branch RF signal S12 that is routed to the drive electrode 103 attenuates as it travels to the movable electrode driving part 101C1.

In this situation the branch RF signal S12 at the drive electrode 103 is substantially equal to the frequency and phase of the main RF signal S11 at the movable electrode 101, while the amplitude slightly lower. The potential change produced by the main RF signal S11 in the movable electrode 101 therefore varies with the potential change produced by the branch RF signal S12 in the drive electrode 103, and the potential difference due to the power between the electrodes can be sufficiently reduced. As a result, when a high power RF signal is input to the electromechanical device 100, a potential difference is not caused by the RF signal between the movable electrode 101 and drive electrode 103, and the self-actuation problem of electrostatic force causing the movable electrode 101 to actuate automatically can be avoided. Furthermore, because self-actuation can be avoided even when the drive part capacitance Cd is somewhat high, electrostatic force per drive voltage unit can be increased. A low voltage drive electromechanical device 100 with high speed response can thus be achieved.

The on state of the electromechanical device 100 is described next. In this state the drive voltage supply part 130 applies the drive voltage Vd between the movable electrode 101 and drive electrode 103. Electrostatic force Fs pulls the movable electrode 101 and drive electrode 103 together, and causes the movable electrode 101 to contact the drive electrode 103 and the signal electrode 105. More specifically, the movable electrode driving part 101C1 contacts the dielectric layer 102 as indicated by movable electrode driving part 101D1, and the distance between the movable electrode driving part 101D1 and the drive electrode driving part 103B is substantially equal to the thickness of the dielectric layer 102. As a result, the movable electrode opening/closing part 101C2 makes contact with the contact 104 as indicated by movable electrode opening/closing part 101D2 (see FIG. 2A and FIG. 2B). In other words, because the movable electrode driving part 101C1 is flexible and the movable electrode driving part 101C1 thus deflects when the drive voltage Vd is applied, the movable electrode opening/closing part 101C2 is displaced from the initial position and contacts the contact 104.

When the movable electrode 101 and signal electrode 105 are resistance coupled by metal-to-metal contact, the opening/closing part resistance Rc formed between the movable electrode opening/closing part 101D2 and the contact 104 is low due to the effect of the contact 104. A conduction path for the RF signal is thus formed, and the RF signal can pass from the movable electrode 101 to the signal electrode 105. As a result, the RF signal input to the movable electrode 101 is substantially passed through the signal electrode 105 to the output node RFOUT.

When the electromechanical device 100 is in the on state, the fixing part capacitance Cf and movable electrode resistance Rm are substantially equal to the off state levels. Because drive part capacitance Cd is formed between the movable electrode driving part 101D1 and drive electrode driving part 103B through the dielectric layer 102, the distance between the electrodes is shorter than in the off state. As a result, the drive part capacitance Cd rises and impedance goes low. Because the movable electrode opening/closing part 101D2 touches the contact 104, the opening/closing part capacitance Cc is replaced by a low opening/closing part resistance Rc.

The input RF signal S10 input to the input node RFIN is split at the movable electrode fixing part 101A into the main RF signal S11 and the branch RF signal S12. The main RF signal S11 passes from the movable electrode fixing part 101A through the movable electrode resistance Rm to the movable electrode driving part 101D1. The branch RF signal S12 passes from the movable electrode fixing part 101A through the fixing part capacitance Cf and drive electrode fixing part 103A to the drive electrode driving part 103B. Because the impedance of the drive part capacitance Cd is low, the branch RF signal S12 diverted to the drive electrode 103 is relatively unattenuated as it travels to the movable electrode driving part 101D1. At the movable electrode driving part 101D1 the main RF signal S11 and branch RF signal S12 merge and pass through the opening/closing part resistance Rc to the output node RFOUT.

When switching from the on state to the off state, the DC potential of the movable electrode 101 and drive electrode 103 are substantially equal and cancel the electrostatic force Fs. As a result, the spring constant of the deflection of the movable electrode driving part 101C1 causes the movable electrode opening/closing part 101C2 to return to its original position.

In addition to this spring force, the drive voltage Vu may be applied between the movable electrode 101 and the fixed comb electrodes 111A and 111B through the drive voltage supply part 131, thus respectively applying electrostatic forces FsA and FsB in a diagonally upward direction as shown in FIG. 2B. This aspect of the invention produces a force causing the movable electrode 101 to move upward and open a gap between the electrodes. As shown in FIG. 1B, an electrode comb is formed between the movable electrode 101 and the fixed comb electrode 111, the electrostatic capacitance is increased by increasing the area of the overlap between the electrodes, and greater electrostatic force can thus be produced.

As described above, the electromechanical device 100 can be reliably switched from the on state to the off state by using both spring force and electrostatic force, and the problem of stiction between the low-voltage-drive, high-speed-response movable electrode 101 and the drive electrode 103 can be avoided. The signal transmission path can thus be opened and closed.

Figure 4A:
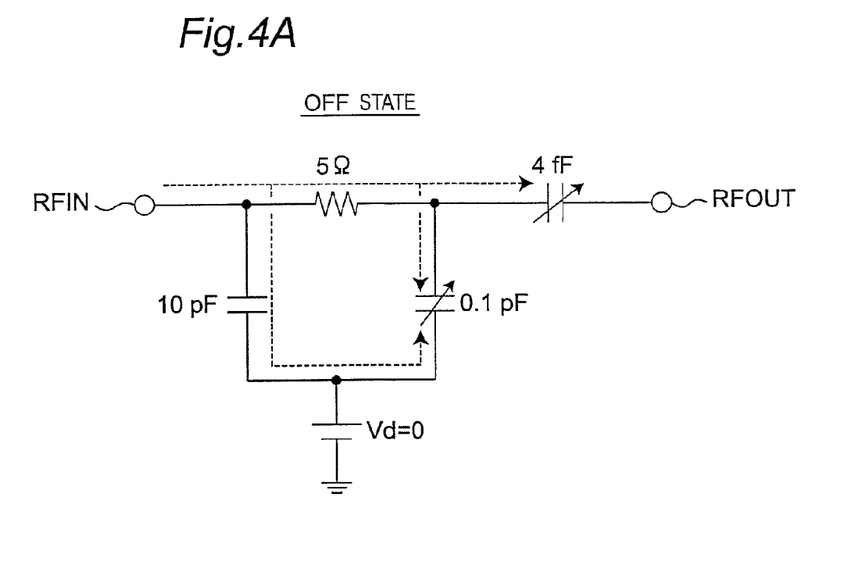
FIG. 4A is an equivalence circuit diagram showing the configuration of the electromechanical device according to the preferred embodiment of the invention when off.
Figure 4B:
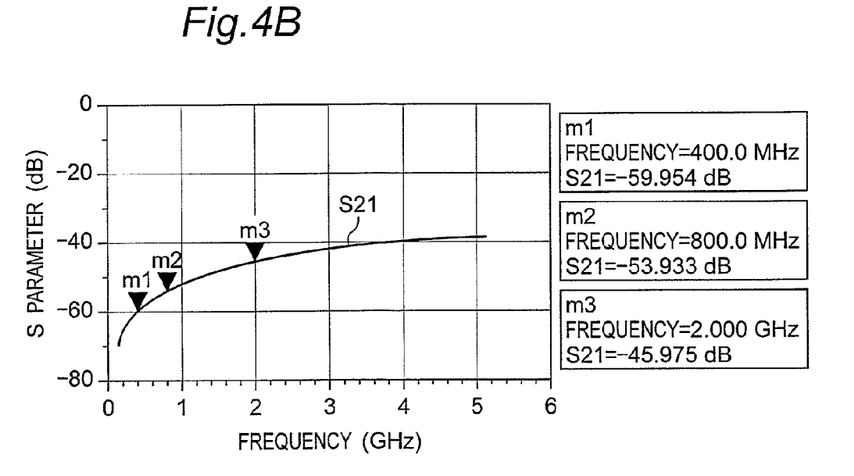
FIG. 4B is a graph showing the frequency characteristic of the S parameter in FIG. 4A.

FIG. 4A and FIG. 4B describe the off state of the electromechanical device 100 according to this embodiment of the invention, FIG. 4A being an equivalence circuit diagram of the electromechanical device 100 and FIG. 4B being a graph showing the frequency characteristic of the S parameter of the electromechanical device 100.

As one example of the device constants of the equivalence circuit in the off state, Cc=4 fF (femtofarad), Cd=0.1 pF, Cf=10 pF, and movable electrode resistance Rm=5Ω. In the frequency range f=400 MHz to 2 GHz, the absolute value of insertion loss S parameter S21 shows a high isolation characteristic of 40 dB or more, demonstrating an off state that greatly attenuates the power of the input RF signal.

Figure 5A:
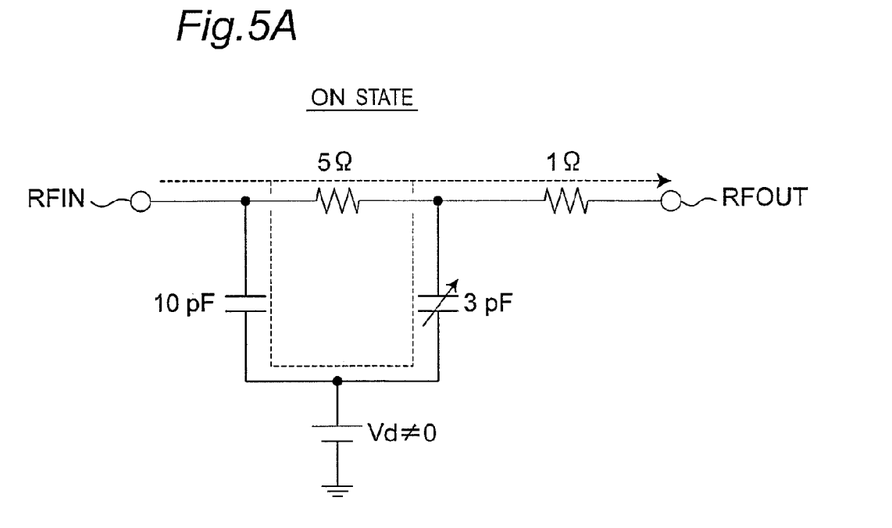
Figure 5B:
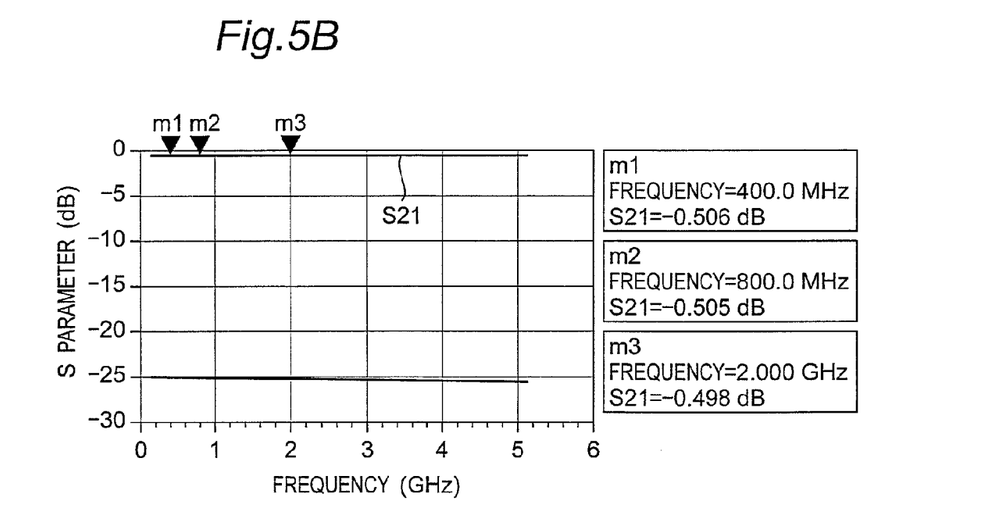
FIG. 5B is a graph showing the frequency characteristic of the S parameter in FIG. 5A.

FIG. 5A and FIG. 5B describe the on state of the electromechanical device 100 according to this embodiment of the invention, FIG. 5A being an equivalence circuit diagram of the electromechanical device 100 and FIG. 5B being a graph showing the frequency characteristic of the S parameter of the electromechanical device 100.

As one example of the device constants of the equivalence circuit in the on state, Rc=1Ω, Cd=3 pF, Cf=10 μF, and movable electrode resistance Rm=5Ω. In the frequency range f=400 MHz to 2 GHz, the absolute value of insertion loss S parameter S21 shows a low insertion loss of 0.5 dB or more, demonstrating an on state that passes the input RF signal with little power loss. When the movable electrode resistance Rm is set to an even lower level, insertion loss can be further decreased.

Note that this embodiment of the invention can also be used in switches (shunt switches) that have the contact part of the movable electrode 101 and signal electrode 105 where the RF signal is coupled in the equivalence circuit of the electromechanical switch connected parallel to the transmission path and take the part downstream therefrom to ground. In a shunt switch the position of the movable electrode 101 in the on and off states is opposite that of a series switch. In the off state the movable electrode 101 and signal electrode 105 make contact. The RF signal passes to ground and is not passed to the output port. In the on state the movable electrode 101 and signal electrode do not contact, and the RF signal passes from the input port to the output port over the signal electrode 105.

The invention can also be applied to capacitive coupling switches in which a dielectric membrane is formed on the surface of at least the movable electrode 101 or signal electrode 105, and an AC signal transmission path is coupled by electrostatic capacitance through the dielectric membrane.

The invention can also use a fixed-fixed beam as the movable electrode.

CONCLUSION

The electromechanical device and electrical device with the electromechanical device according to the present invention can reduce the potential difference produced by the power between the movable electrode 101 and drive electrode 103 by the fixing part capacitance Cf. As a result, when a high power RF signal is input to the electromechanical device 100, a potential difference is not caused by the RF signal between the movable electrode 101 and drive electrode 103, and the self-actuation problem of electrostatic force causing the movable electrode 101 to actuate automatically can be avoided. A high reliability electromechanical device and electrical device with the electromechanical device that can switch reliably between the on state and off state regardless of the input RF signal can therefore be achieved.

The electromechanical device according to the present invention is useful as a high reliability electromechanical device and an electrical device with the electromechanical device.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

INDUSTRIAL APPLICABILITY

The present invention can be used in an electromechanical device and an electrical device with the electromechanical device.

| Reference | Signs List |
|---|---|
| 100 | electromechanical device |
| 101 | movable electrode |
| 101A | movable electrode fixing part |
| 101B | movable electrode bending part |
| 101C | movable electrode moving part |
| 101C1, 101D1 | movable electrode driving parts |
| 101C2, 101D2 | movable electrode opening/closing parts |
| 102, 107, 109 | dielectric layer |
| 103 | drive electrode |
| 103A | drive electrode fixing part |
| 103B | drive electrode driving part |
| 104 | contact |
| 105 | signal electrode |
| 105A | signal electrode opening/closing part |
| 110 | substrate |
| 111A, 111B | fixed comb electrode |
| 112A, 112B | support part |
| 120 | partial area |
| 121, 122, 123 | electrode gap |
| 130, 131 | drive voltage supply part |
| RFIN | input node |
| RFOUT | output node |
| VdIN | drive node |
| VulNA | drive node |
| VulNB | drive node |

What is claimed is:

1. An electromechanical device comprising:
a first electrode having a first part, a second part, and a third part integrated with one another;
a second electrode having a first opposing part opposite the first part; and
a third electrode having a second opposing part opposite the second part through an intervening gap or dielectric layer, and a third opposing part opposite the third part,
wherein the third electrode includes an input node that receives a first drive voltage referenced to a DC potential of the first electrode,
wherein the intervening gap is set to a first predetermined distance when the first drive voltage is a first voltage, and the intervening gap is set to a second predetermined distance when the first drive voltage is a second voltage, wherein the first part is separated from the first opposing part and electrically isolated from the first opposing part when the first drive voltage is the first voltage, wherein, when the first drive voltage is the second voltage, the first part contacts the first opposing part and is electrically conductive with the first opposing part, and an RF signal input to the first electrode is substantially output from the second electrode, wherein the third part and the third opposing part constitute a first electrical capacitance of a predetermined capacity, wherein the second part and the second opposing part constitute a second electrical capacitance of a predetermined capacity when the first drive voltage is the first voltage, wherein the first part and the first opposing part constitute a third electrical capacitance of a predetermined capacity when the first drive voltage is the first voltage, and wherein the capacity of the first electrical capacitance is greater than the second electrical capacitance and the third electrical capacitance.

2. The electromechanical device described in claim 1, wherein third part and the third opposing part are in opposition through a solid-state dielectric membrane.

3. The electromechanical device described in claim 1, wherein the third electrode receives the RF signal through the first electrical capacitance.

4. The electromechanical device described in claim 1, further comprising:
a fourth electrode positioned opposite the second part and around the second part,
wherein the fourth electrode includes an input node that receives a second drive voltage referenced to a DC potential of the first electrode.

5. The electromechanical device described in claim 4, wherein mutually opposing sides of the second part and the fourth electrode have a comb-like shape formed so that spaces on one side mesh with tines on the other side with a gap therebetween.

6. The electromechanical device described in claim 1, wherein the second predetermined distance is shorter than the first predetermined distance.

7. The electromechanical device described in claim 1, further comprising:
a substrate to which the third part and the third opposing part are affixed.

8. The electromechanical device described in claim 7, wherein the first electrode has a cantilevered structure, and the first part and second part are free bodies.

9. The electromechanical device described in claim 1, wherein the first electrode is deflectable.

10. The electromechanical device described in claim 9, wherein the second part is deflectable,
wherein the first part is caused to displace from an initial position and contact the first opposing part due to deflection of the second part when the first drive voltage is the second voltage, and
wherein the first part returns to the initial position due to the deflectability of the second part when the first drive voltage is the first voltage.

11. The electromechanical device described in claim 1, wherein the second part is positioned between the first part and the third part.

12. The electromechanical device described in claim 11, wherein the first electrode has a fourth part,
wherein the fourth part is positioned between the second part and the third part, and
wherein the second part and the third part are bent at the fourth part.

13. An electrical device comprising the electromechanical device described in claim 1.

14. The electromechanical device described in claim 1, wherein the third part of the first electrode is fixed to the third opposing part of the third electrode through a dielectric layer.

15. The electromechanical device described in claim 1, wherein the capacity of the first electrical capacitance when the first drive voltage is the first voltage is substantially equal to the capacity of the first electrical capacitance when the first drive voltage is the second voltage.

* * * * *